United States Patent
Lam et al.

(10) Patent No.: US 10,091,919 B2
(45) Date of Patent: Oct. 2, 2018

(54) APPARATUS FOR SECURING ELECTRONIC DEVICES ON A CARRIER DURING TRANSPORTATION

(71) Applicant: ASM Technology Singapore Pte Ltd, Singapore (SG)

(72) Inventors: Yan Yiu Lam, Hong Kong (HK); Shing Kai Yip, Hong Kong (HK); Yu Sze Cheung, Hong Kong (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 15/440,053

(22) Filed: Feb. 23, 2017

(65) Prior Publication Data

US 2018/0242481 A1    Aug. 23, 2018

(51) Int. Cl.
*B65G 15/58*    (2006.01)
*B65G 17/46*    (2006.01)
*H05K 13/00*    (2006.01)
*B65H 23/28*    (2006.01)

(52) U.S. Cl.
CPC .......... *H05K 13/003* (2013.01); *B65H 23/28* (2013.01)

(58) Field of Classification Search
CPC ............................... B65G 15/58; B65G 17/46
USPC .......... 198/688.1, 690.1, 803.6, 805, 867.04, 198/867.12; 29/744; 414/749.1, 749.2
See application file for complete search history.

(56) References Cited

U.S. PATENT DOCUMENTS

| | | | | |
|---|---|---|---|---|
| 3,868,764 A * | 3/1975 | Hartleroad | ............. | B23K 1/012 228/123.1 |
| 4,708,245 A * | 11/1987 | Boeckmann | ........... | B65D 73/02 206/714 |
| 4,944,979 A * | 7/1990 | Gagliano | ............... | B65D 73/02 206/714 |
| 6,398,016 B1 * | 6/2002 | Maeder | .................. | B65H 29/02 198/805 |
| 6,429,384 B1 * | 8/2002 | Downes, Jr. | ............ | H01L 24/81 174/250 |
| 7,762,386 B2 * | 7/2010 | Allore | .................... | B65G 17/46 198/472.1 |
| 8,789,267 B2 * | 7/2014 | Peng | ....................... | H01L 24/95 29/740 |
| 9,090,403 B2 * | 7/2015 | Ng | ......................... | B65G 15/30 |
| 9,561,914 B1 * | 2/2017 | Yip | ..................... | B65G 47/8884 |
| 9,617,089 B2 * | 4/2017 | Josefowitz | ............ | B60L 13/003 |
| 9,633,878 B1 * | 4/2017 | Krishnan | ......... | H01L 21/67721 |
| 9,850,074 B2 * | 12/2017 | Yip | ........................ | B65G 25/04 |

* cited by examiner

*Primary Examiner* — Douglas A Hess
(74) *Attorney, Agent, or Firm* — Ostrolenk Faber LLP

(57) ABSTRACT

An apparatus for securing electronic devices on a carrier for storing electronic devices during transportation of the electronic devices on the carrier has a guiding track for guiding motion of the carrier when the carrier receives electronic devices. A magnetic track located adjacent to the guiding track attracts the electronic devices onto the carrier with a magnetic attraction force. In particular, the magnetic track has a support surface facing the carrier that has a smaller width than a width of a portion of the magnetic track that is spaced from the support surface.

14 Claims, 4 Drawing Sheets

APPARATUS FOR SECURING ELECTRONIC DEVICES ON A CARRIER DURING TRANSPORTATION

FIELD OF THE INVENTION

The invention relates to the placement of electronic devices onto a carrier for transportation thereof, and in particular to the transportation of said electronic devices on the carrier before they are sealed in the carrier for storage.

BACKGROUND AND PRIOR ART

Carriers, such as carriers in the form of tapes, are often used for storing packaged semiconductor devices. FIG. 1 is an isometric view of a conventional offloading apparatus 10 comprising a guiding track 16 for guiding a carrier tape 12 for storing electronic devices. The guiding track 16 guides the carrier tape 12 lengthwise and there is a recess 14 along the guiding track 16 where the carrier tape 12 is exposed for receiving electronic devices. A pick head 18 picks up electronic devices and places them onto the carrier tape 12 through the recess. Typically, the carrier tapes 12 used are made from plastic.

FIG. 2 is a cross-sectional view of a conventional plastic carrier tape 12 comprising vacuum holes 24 for securing electronic devices on the plastic carrier tape 12 using vacuum suction. The plastic carrier tape 12 has a plurality of pockets 22, each for storing a single electronic device 20. The pockets 22 have pre-formed vacuum holes 24 at their base portions underneath where the electronic devices 20 are placed so that the devices can be held against the base portions by vacuum suction force. A vacuum port 26 is located below the vacuum holes 24 to provide such vacuum suction force to hold the electronic devices 20.

Thus, the guiding track 16 indexes the plastic carrier tape 12 to present an empty pocket 22 to the pick head 18. The pick head 18 picks up an electronic device 20 and places the electronic device 20 into an empty pocket 24 through the recess 14. While in the pocket 22, the electronic device 20 is held by vacuum suction generated by the vacuum port 26 to secure the electronic device 20 so that it does not jump out of the pocket 22 due to turbulence during conveyance along the guiding track 16.

Whilst this approach is sufficient for conventional electronic devices, for electronic devices 20 that are relatively smaller in size, it is not feasible to form vacuum holes 24 at the base portions of these plastic carrier tapes 12. Without an adequate holding force to secure the electronic devices 20 in the pockets 22, the smaller electronic devices 20 will face a significant risk of jumping out of the plastic carrier tape 12 or flipping during their transportation due to turbulence. This will result in unnecessary yield loss.

It would be beneficial to develop another way of securing the small electronic devices 20 in the pockets 22 during their transportation that is capable of exerting a retention force to retain the small electronic devices more securely to reduce unnecessary yield loss.

SUMMARY OF THE INVENTION

It is thus an object of the invention to seek to provide an adequate retention force in order to secure small devices on a carrier during transportation while avoiding the use of vacuum suction.

Accordingly, the invention provides an apparatus for securing electronic devices on a carrier for storing electronic devices during transportation of the electronic devices on the carrier, the apparatus comprising: a guiding track for guiding motion of the carrier when the carrier receives electronic devices; and a magnetic track located adjacent to the guiding track which is operative to attract the electronic devices onto the carrier with a magnetic attraction force; wherein the magnetic track has a support surface facing the carrier having a smaller width than a width of a portion of the magnetic track that is spaced from the support surface.

It would be convenient hereinafter to describe the invention in greater detail by reference to the accompanying drawings which illustrate a specific preferred embodiment of the invention. The particularity of the drawings and the related description is not to be understood as superseding the generality of the broad identification of the invention as defined by the claims.

BRIEF DESCRIPTION OF THE DRAWINGS

An example of an apparatus for securing electronic devices in accordance with the invention will now be described with reference to the accompanying drawings, in which.

DETAILED DESCRIPTION OF THE PREFERRED EMBODIMENT OF THE INVENTION

Figure 1:
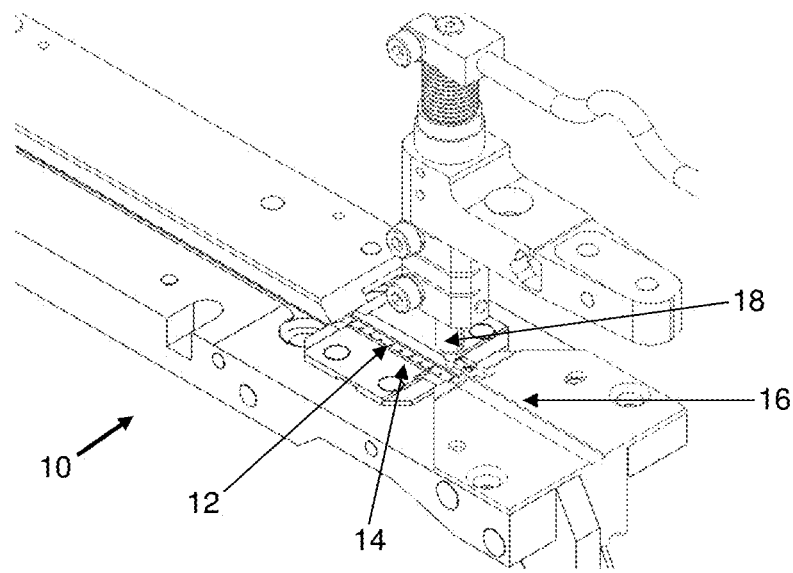
FIG. 1 is an isometric view of a conventional offloading apparatus comprising a guiding track for guiding a carrier tape for storing electronic devices.
Figure 2:
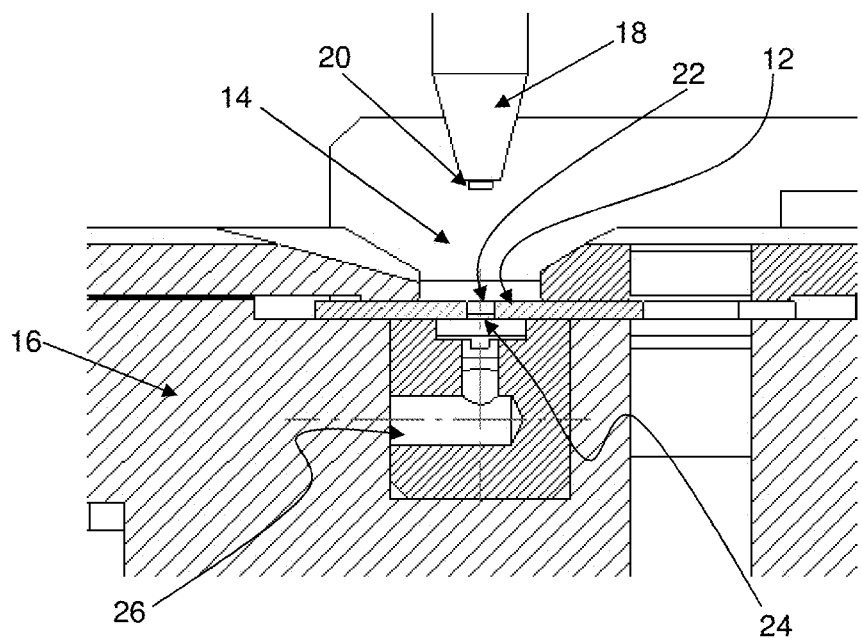
FIG. 2 is a cross-sectional view of a conventional plastic carrier tape comprising vacuum holes for securing electronic devices on the plastic carrier tape using vacuum suction.
Figure 3:
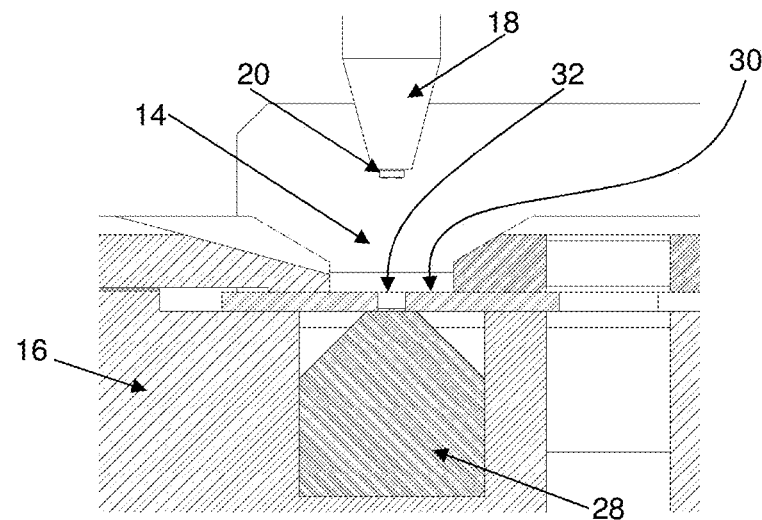
FIG. 3 is a cross-sectional view of a magnetic track according to the preferred embodiment of the invention which is located along the guiding track.

FIG. 3 is a cross-sectional view of a magnetic track 28 according to the preferred embodiment of the invention which is located along the guiding track 16. The guiding track 16 includes a path along which a carrier, which may be in the form of a carrier tape 30 made from paper, is conveyed. A carrier tape 30 made from paper is advantageous for use with the preferred embodiment of the invention as it allows magnetic flux to pass through it. However, it should be appreciated that the use of other material for the carrier tape 30 that is permeable to magnetic attraction forces would also be suitable for use with the invention. The guiding track 16 guides motion of the carrier tape 30 for receiving electronic devices 20.

The carrier tape 30 comprises a plurality of pockets 32 along the length of the carrier tape 30 that are configured for storing electronic devices 20. Each pocket 32 is preferably configured for storing one electronic device 20. The guiding track 16 comprises a recess 14 through which the pockets 32 of the carrier tape 30 are accessible by a pick head 18. The pick head 18 is configured to pick up an electronic device 20 and to place it into a pocket 32 that is presented to the pick head 18 through the recess 14.

The magnetic track 28 is located adjacent to the guiding track 16, preferably below the carrier tape 30. It is operative to attract the electronic devices 20 onto the carrier tape 30 using a magnetic attraction force. Once the electronic device 20 has been placed into the pocket 32, magnetic attraction force from the magnetic track 28 secures the electronic device 20 onto a base portion of the pocket 32. Accordingly, such magnetic attraction force secures the electronic devices 20 to reduce the risk of smaller electronic devices 20 jumping out of the carrier tape 30 or flipping during their transportation. There is no need for a hole at the base of the carrier tape 30, such as those found in prior art plastic carrier tapes 12, since the carrier tape 30 made from paper is permeable to magnetic flux and magnetic attraction forces, and the electronic devices 20 correspondingly comprise metals that can be attracted by such magnetic forces.

Figure 4:
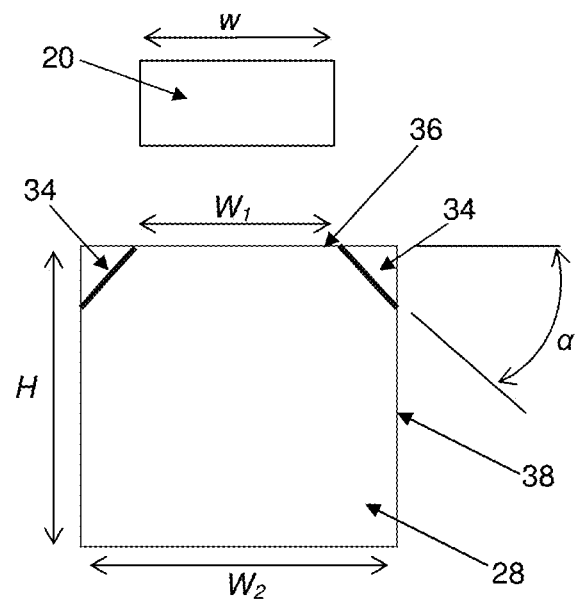
FIG. 4 is a cross-sectional view of the magnetic track according to the preferred embodiment of the invention.

FIG. 4 is a cross-sectional view of the magnetic track 28 according to the preferred embodiment of the invention. The magnetic track 28 comprises chamfers 34 on opposing top portions of the magnetic track 28. Between the chamfers 34 is a support surface 36 of the magnetic track 28 facing the carrier tape 30, on which the carrier tape 30 is supported. Thus, the chamfers 34 line either side of the elongated support surface 36, and the carrier tape 30 (together with the electronic devices 20 stored in the pockets 32 of the carrier tape 30) is transported along the support surface 36 positioned in between the chamfers 34.

Due to the presence of the chamfers 34, a width $W_1$ of the support surface 36 is narrower than a width of another portion of the magnetic track 28 that is spaced from the support surface 36, such as a width $W_2$ at a base of the magnetic track 28 opposite to the support surface 36. The width $W_1$ of the support surface 36 should preferably be wider than a width w of the electronic device 20. More preferably, the width $W_1$ of the support surface 36 is more than 1 mm wider than the width w of the electronic device 20. Moreover, each chamfer 34 should be inclined at an angle to the support surface 36 and a side wall of the magnetic track 28, the magnetic track 28 having a height H including the side wall and chamfer 34. The angle $\alpha$ that each chamfer 34 makes with respect to the support surface 36 is preferably between 45° and 75°. Most preferably, the angle $\alpha$ is substantially equal to 60°.

Figure 5:
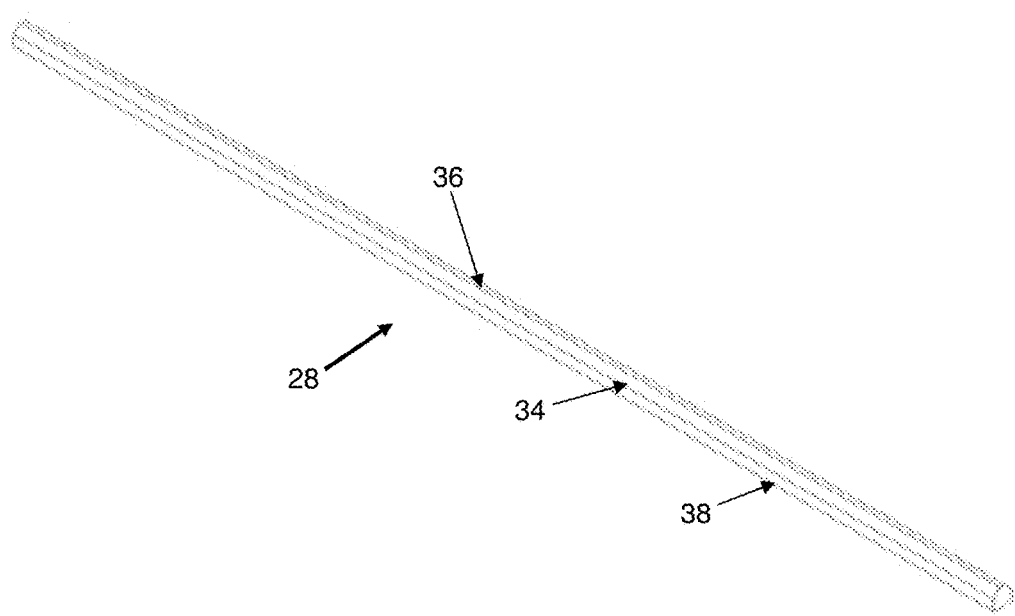
FIG. 5 is an isometric view of only the magnetic track which is arranged along a length of the guiding track.

FIG. 5 is an isometric view of only the magnetic track 28 which is arranged along a length of the guiding track 16. The magnetic track 28 is in the form of an elongated magnetic strip, wherein the chamfers 34 line either side of the support surface 36. The magnetic track 28 provides a magnetic attraction force for securing the electronic devices 20 in the pockets 32 when electronic devices 20 placed into the pockets 32 are conveyed by the carrier tape 30 over the magnetic track 28. The support surface 36 of the magnetic track 28 is located between the chamfers 34 formed at the top corners of the magnetic track 28. The chamfers 34 serve to concentrate the magnetic attraction forces onto the electronic devices 20, and help to retain the electronic devices 20 more securely.

Figure 6A:
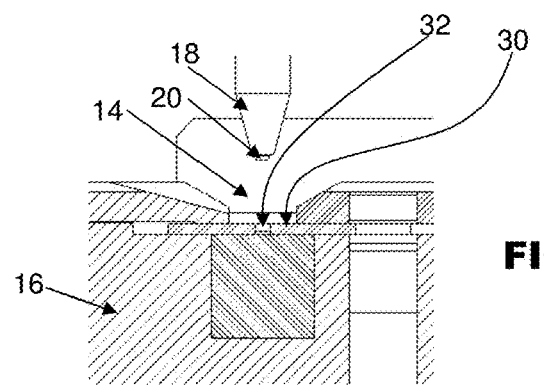
FIGS. 6A-6D illustrate a placing sequence of the electronic devices onto the carrier tape.

FIGS. 6A-6D illustrate a placing sequence of the electronic devices 20 onto the carrier tape 30. In FIG. 6A, the pick head 18 has picked up an electronic device 20 and has moved the electronic device 20 to a position over an empty pocket 32 comprised in the carrier tape 30.

Figure 6B:
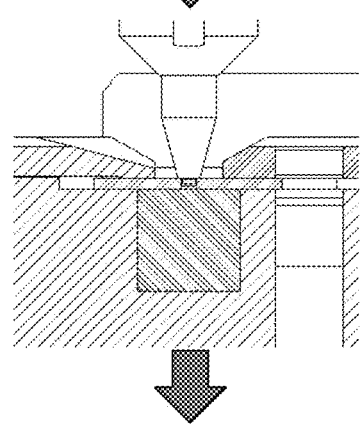
Figure 6C:
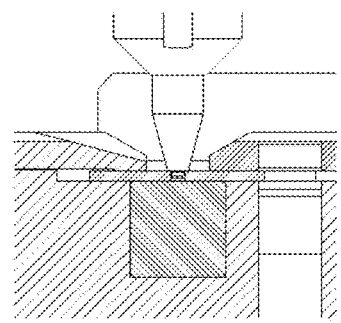

In FIG. 6B, the electronic device 20 is lowered by the pick head 18 towards the pocket 32 through the recess 14 in the guiding track 16. In FIG. 6C, the electronic device 20 has been placed into the pocket 32.

Figure 6D:
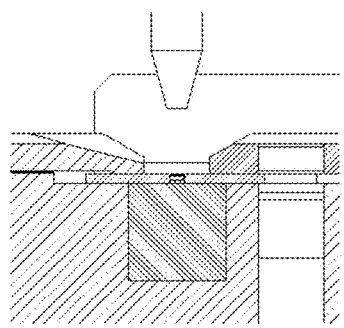

In FIG. 6D, the pick head 18 has released the electronic device 20. The electronic device 20 remains in the pocket 32 and is secured at the base of the pocket 32 by magnetic attraction force from the magnetic track 28. The carrier tape 30 can now be indexed so that a next empty pocket 32 is presented to the pick head 18 for storing another electronic device 20.

It should be appreciated that the magnetic track 28 according to the preferred embodiment of the invention enables electronic devices 20 to be retained securely on a carrier tape 30 when they are being transported during offloading. Further, the shape of the magnetic track 28 focuses its magnetic field onto the electronic devices 20 to increase the magnetic attraction force that is available to secure the electronic devices 20 when they are being transported. This reduces the risk that electronic devices 20 may flip or be lost during transportation due to turbulence.

Although the chamfers 34 are illustrated as flat sloping surfaces, they could also comprise curved surfaces, as long as the width $W_1$ of the support surface 36 is reduced relative to the portion of the magnetic track 28 that is below the support surface 36.

The invention described herein is susceptible to variations, modifications and/or additions other than those specifically described and it is to be understood that the invention includes all such variations, modifications and/or additions which fall within the spirit and scope of the above description.

The invention claimed is:

1. An apparatus for securing electronic devices on a carrier that stores electronic devices during transportation of the electronic devices on the carrier, the apparatus comprising:
   a guiding track configured to guide motion of the carrier when the carrier receives electronic devices for storage; and
   a magnetic track fixedly located adjacent to the guiding track, and the magnetic track is configured to attract the electronic devices onto the carrier with a magnetic attraction force when the carrier is located between the electronic devices and the magnetic track;
   wherein the magnetic track is separate from the carrier and comprises a support surface facing the carrier,
   wherein the support surface has a smaller width than a width of a portion of the magnetic track that is spaced from the support surface.

2. The apparatus as claimed in claim 1, wherein the carrier comprises a tape that has a plurality of pockets along a length thereof for storing the electronic devices,
   wherein each pocket is configured for storing one electronic device.

3. The apparatus as claimed in claim 1, wherein the carrier is made from a material that is permeable to magnetic attraction forces.

4. The apparatus as claimed in claim 1, wherein the guiding track comprises a recess configured to provide access to the carrier for receiving electronic devices.

5. The apparatus as claimed in claim 1, wherein the support surface is located below the carrier and is operative to support the carrier.

6. The apparatus as claimed in claim 5, wherein the electronic devices are attracted by the magnetic attraction force towards a base portion of the carrier.

7. The apparatus as claimed in claim 1, wherein the support surface comprises at least one chamfer adjacent to the said support surface for reducing a width of the support surface relative to the portion of the magnetic track that is spaced from the support surface.

8. The apparatus as claimed in claim 7, wherein the said support surface is positioned between two chamfers, each chamfer being located on one side of the support surface.

9. The apparatus as claimed in claim 8, wherein the magnetic track forms an elongated magnetic strip, and the chamfers line either side of the support surface along which the carrier is guided.

10. The apparatus as claimed in claim 7, wherein the at least one chamfer is inclined at an angle of between 45° and 75° with respect to the support surface.

11. The apparatus as claimed in claim 7, wherein the chamfers are operative to cause the magnetic track to concentrate magnetic attraction forces onto the electronic devices received on the carrier.

12. The apparatus as claimed in claim 1, wherein the width of the support surface is configured to be wider than a width of the electronic devices that are being secured.

13. The apparatus as claimed in claim 12, wherein the width of the support surface is configured to be more than 1 mm wider than the width of the electronic devices that are being secured.

14. The apparatus as claimed in claim 1, wherein the width of the support surface is narrower than a width of another surface of the magnetic track that is opposite to the support surface.

\* \* \* \* \*